United States Patent
Jensen et al.

(10) Patent No.: US 7,700,409 B2
(45) Date of Patent: Apr. 20, 2010

(54) METHOD AND SYSTEM FOR STACKING INTEGRATED CIRCUITS

(75) Inventors: Ronald J. Jensen, Bloomington, MN (US); Walter W. Heikkila, Burnsville, MN (US)

(73) Assignee: Honeywell International Inc., Morristown, NJ (US)

( * ) Notice: Subject to any disclaimer, the term of this patent is extended or adjusted under 35 U.S.C. 154(b) by 176 days.

(21) Appl. No.: 11/753,669

(22) Filed: May 25, 2007

(65) Prior Publication Data
US 2007/0222055 A1   Sep. 27, 2007

Related U.S. Application Data

(63) Continuation-in-part of application No. 10/852,378, filed on May 24, 2004.

(51) Int. Cl.
   *H01L 21/00*   (2006.01)
(52) U.S. Cl. .............. 438/109; 257/686; 257/690; 257/E25.013; 438/108; 438/113
(58) Field of Classification Search ........ 257/690, 257/E25.013, 686; 438/108, 109, 113
   See application file for complete search history.

(56) References Cited

U.S. PATENT DOCUMENTS

| | | | |
|---|---|---|---|
| 5,229,960 A | 7/1993 | De Givry | 365/63 |
| 6,469,370 B1 | 10/2002 | Kawahara et al. | 257/678 |
| 6,472,741 B1 | 10/2002 | Chen | 257/712 |
| 6,511,901 B1 | 1/2003 | Lam | 438/612 |
| 6,555,917 B1 | 4/2003 | Heo | 257/777 |
| 6,611,434 B1 | 8/2003 | Lo | 361/760 |
| 6,621,169 B2 | 9/2003 | Kikuma | 257/780 |
| 6,759,307 B1 | 7/2004 | Yang | |
| 6,900,528 B2 | 5/2005 | Mess et al. | 257/686 |
| 2001/0000013 A1* | 3/2001 | Lin | 257/777 |
| 2001/0003375 A1 | 6/2001 | Kovats et al. | 257/685 |
| 2002/0180025 A1 | 12/2002 | Miyata et al. | 257/690 |

(Continued)

FOREIGN PATENT DOCUMENTS

EP   0782191   2/1997

(Continued)

OTHER PUBLICATIONS

International Search Report for PCT/US2005/018089 dated Nov. 16, 2005.

(Continued)

*Primary Examiner*—Wael Fahmy
*Assistant Examiner*—John C Ingham
(74) *Attorney, Agent, or Firm*—Shumaker & Sieffert, P.A.

(57) ABSTRACT

A design for stacking integrated circuits is described. Some integrated circuits have multiple signal pads that are common between a top integrated circuit and a bottom integrated circuit in an integrated circuit pair. These common pads are placed symmetrically on the integrated circuit. Unique signal pads are provided independently to each integrated circuit in a stack. An optional array of solder bumps placed over a central area of the integrated circuit may be used, which provides for heat transfer through the stack. When stacking multiple pairs of integrated circuits, the top integrated circuit in the integrated circuit stack pair serves as a spacer between the first and second pair of integrated circuits.

9 Claims, 7 Drawing Sheets

U.S. PATENT DOCUMENTS

2004/0021230 A1    2/2004    Tsai et al. .................. 257/777
2005/0173807 A1    8/2005    Zhu et al. .................. 257/777

FOREIGN PATENT DOCUMENTS

JP            2003133509       9/2003

OTHER PUBLICATIONS

Written Opinion of the International Searching Authority dated Nov. 16, 2005 for PCT/US2005/018089.
Office Action dated Sep. 30, 2005 for U.S. Appl. No. 10/852,378, 5 pgs.
Response dated Oct. 26, 2005 for U.S. Appl. No. 10/852,378, 2 pgs.
Office Action dated Nov. 15, 2005 for U.S. Appl. No. 10/852,378, 12 pgs.
Response dated Feb. 15, 2006 for U.S. Appl. No. 10/852,378, 17 pgs.
Office Action dated Apr. 12, 2006 for U.S. Appl. No. 10/852,378, 12 pgs.
Response dated Jun. 12, 2006 for U.S. Appl. No. 10/852,378, 6 pgs.
Advisory Action dated Jun. 28, 2006 for U.S. Appl. No. 10/852,378, 3 pgs.
RCE dated Aug. 7, 2006 for U.S. Appl. No. 10/852,378, 16 pgs.
Office Action dated Sep. 5, 2006 for U.S. Appl. No. 10/852,378, 8 pgs.
Response dated Dec. 5, 2006 for U.S. Appl. No. 10/852,378, 12 pgs.
Office Action dated Feb. 27, 2007 for U.S. Appl. No. 10/852,378, 10 pgs.
Response dated Apr. 24, 2007 for U.S. Appl. No. 10/852,378, 5 pgs.
Advisory Action dated May 22, 2007 for U.S. Appl. No. 10/852,378, 3 pgs.
Notice of Appeal dated Jun. 25, 2007 for U.S. Appl. No. 10/852,378, 1 pg.
RCE dated Aug. 21, 2007 for U.S. Appl. No. 10/852,378, 8 pgs.
Office Action dated Oct. 29, 2007 for U.S. Appl. No. 10/852,378, 7 pgs.
Response dated Feb. 29, 2008 for U.S. Appl. No. 10/852,378, 10 pgs.
Office Action dated Jun. 11, 2008 for U.S. Appl. No. 10/852,378, 13 pgs.
Response dated Dec. 3, 2008 for U.S. Appl. No. 10/852,378, 10 pgs.
Office Action dated Feb. 11, 2009 for U.S. Appl. No. 10/852,378, 12 pgs.
RCE dated Jul. 11, 2009 for U.S. Appl. No. 10/852,378, 13 pgs.

\* cited by examiner

METHOD AND SYSTEM FOR STACKING INTEGRATED CIRCUITS

RELATED APPLICATIONS

This application is a continuation-in-part of U.S. patent application Ser. No. 10/852,378, filed on May 24, 2004. The entire disclosure of U.S. patent application Ser. No. 10/852,378 is incorporated by reference.

FIELD OF THE INVENTION

The present invention relates generally to stacking integrated circuits, and more particularly, relates to stacking integrated circuits using flip chip and wire bonding technologies.

BACKGROUND

Three-dimensional integrated circuits are employed in applications in which space is a critical design factor. As the demand for more functionality in less space increases, so does the demand for three-dimensional packaging. In addition to the benefit of reducing space, these designs may also realize higher speeds because interconnects between circuit components may be shorter.

When integrated circuits are stacked, there needs to be a way to supply power, ground, and input/output (I/O) signals to each integrated circuit in the stack. Further, there needs to be a way to connect each integrated circuit in the stack to the next level of interconnection (e.g., to the next integrated circuit or to a printed circuit board). Additionally, there needs to be a way to dissipate heat generated by the stacked integrated circuits.

A method for stacking integrated circuits of the same size is important in some applications. For example, stacking memory chips to form a memory module is commonly performed to increase data storage capacity in an electronic device. Accordingly, there needs to be a way of stacking integrated circuits having the same size.

SUMMARY

A method for stacking integrated circuits is described. The method includes providing a first integrated circuit, a second integrated circuit, a third integrated circuit, and a fourth integrated circuit. The integrated circuits have a substantially similar integrated circuit design, and signal pads in common to the integrated circuits are placed symmetrically about a line through a center of the integrated circuits.

The method further includes creating a first integrated circuit pair by flip chip bonding the first integrated circuit to the second integrated circuit, and creating a second integrated circuit pair by flip chip bonding the third integrated circuit to the fourth integrated circuit. The first integrated circuit is smaller than the second integrated circuit, and the third integrated circuit is smaller than the fourth integrated circuit.

The method further includes attaching the first integrated circuit pair to a substrate; stacking the second integrated circuit pair on the first integrated circuit pair; connecting the second integrated circuit to the substrate using wire bonding; and connecting the fourth integrated circuit to the substrate using wire bonding. The method may further include placing a signal pad unique to one of the integrated circuits opposite a blank pad on an opposite side of the integrated circuit.

The step of creating the first integrated circuit pair may include removing wire bond pads from the first integrated circuit and positioning active surfaces of the first and second integrated circuits to be facing each other prior to the flip chip bonding. Alternatively, the step of creating the first integrated circuit pair includes using two integrated circuit patterns for the first and second integrated circuits, wherein pattern differences are limited to bond pad metallization and passivation openings, and positioning active surfaces of the first and second integrated circuits to be facing each other prior to the flip chip bonding.

The step of creating the second integrated circuit pair may include removing wire bond pads from the third integrated circuit and positioning active surfaces of the third and fourth integrated circuits to be facing each other prior to the flip chip bonding. Alternatively, the step of creating the second integrated circuit pair includes using two integrated circuit patterns for the third and fourth integrated circuits, wherein pattern differences are limited to bond pad metallization and passivation openings, and positioning active surfaces of the third and fourth integrated circuits to be facing each other prior to the flip chip bonding.

The step of attaching the first circuit pair to the substrate may include attaching an inactive surface of the second integrated circuit to the substrate using an adhesive. The step of stacking the second integrated circuit pair on the first integrated circuit pair may include attaching an inactive surface of the fourth integrated circuit to an inactive surface of the first integrated circuit using an adhesive. The step of connecting the second integrated circuit to the substrate using wire bonding may include attaching bonding wires between the second integrated circuit and the substrate. The step of connecting the fourth integrated circuit to the substrate using wire bonding may include attaching bonding wires between the fourth integrated circuit and the substrate.

A stacked integrated circuit is also described. The stacked integrated circuit includes a substrate and first, second, third, and fourth integrated circuits having a substantially similar integrated circuit design, and signal pads in common to the integrated circuits are placed symmetrically about a line through a center of the integrated circuits. The first integrated circuit is smaller than the second integrated circuit, and the third integrated circuit is smaller than the fourth integrated circuit.

The stacked integrated circuit also includes a first integrated circuit pair including the first integrated circuit and the second integrated circuit. An active surface of the first integrated circuit is attached to an active surface of the second integrated circuit using flip chip bonding. The first integrated circuit pair is stacked on the substrate. The second integrated circuit is connected to the substrate using wire bonding.

The stacked integrated circuit also includes a second integrated circuit pair including the third integrated circuit and the fourth integrated circuit. An active surface of the third integrated circuit is attached to an active surface of the fourth integrated circuit using flip chip bonding. The second integrated circuit pair is stacked on the first integrated circuit pair. The fourth integrated circuit is connected to the substrate using wire bonding.

The stacked integrated circuit may further include a signal pad unique to one of the integrated circuits placed opposite a blank pad on an opposite side of the integrated circuit.

Wire bond pads may be removed from the first integrated circuit prior to the flip chip bonding. Alternatively, the first integrated circuit has a first integrated circuit pattern and the second integrated circuit has a second integrated circuit pattern. The pattern differences between the first and second integrated circuit patterns may be limited to bond pad metallization and passivation openings.

Wire bond pads may be removed from the third integrated circuit prior to the flip chip bonding. Alternatively, the third integrated circuit has a third integrated circuit pattern and the fourth integrated circuit has a fourth integrated circuit pattern. The pattern differences between the third and fourth integrated circuit patterns may be limited to bond pad metallization and passivation openings.

An adhesive layer may be located between an inactive surface of the second integrated circuit and the substrate. An adhesive layer may also be located between an inactive surface of the first integrated circuit and an inactive surface of the fourth integrated circuit.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

I. Forming an Integrated Circuit Pair According to a First Embodiment

Figure 1A:
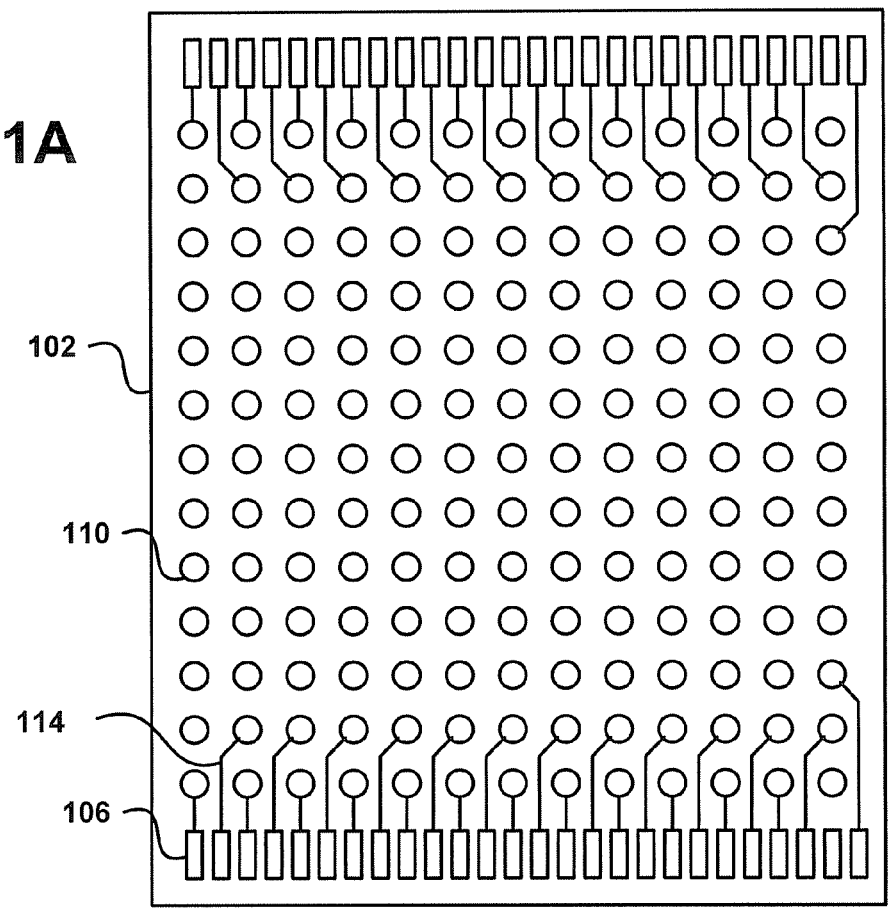
FIG. 1 is a top view of a first integrated circuit and a second integrated circuit, according to a first embodiment.
Figure 1B:
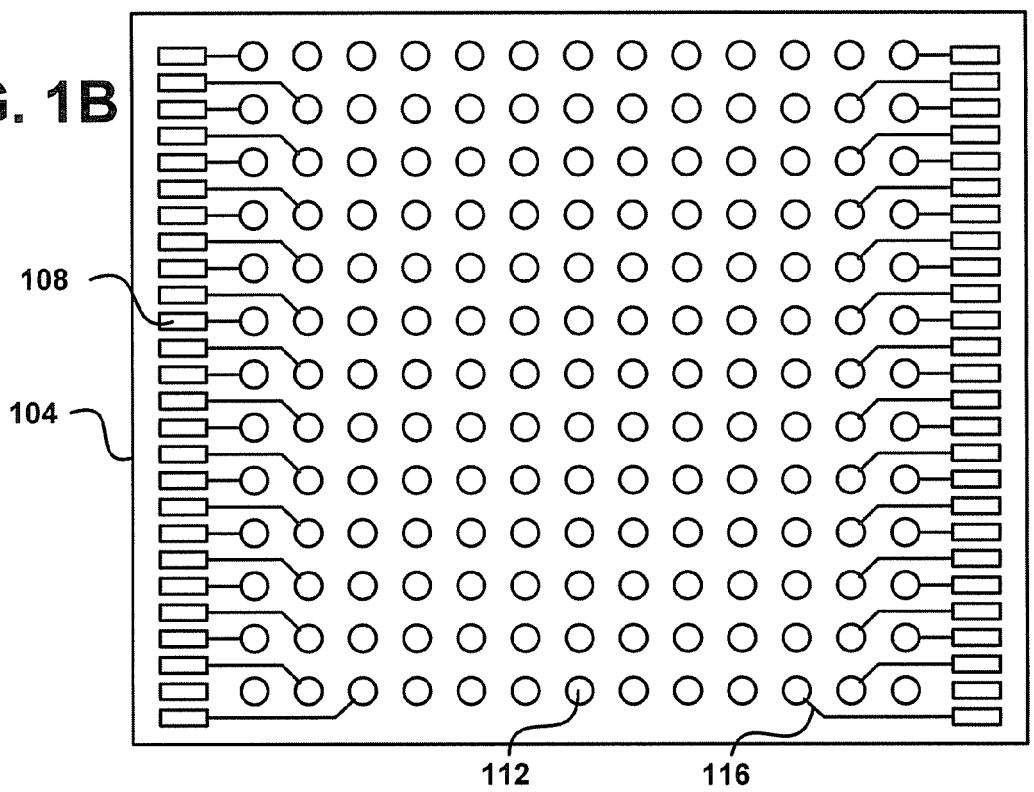

FIG. 1A depicts a top view of a first integrated circuit 102 and FIG. 1B depicts a top view of a second integrated circuit 104. The first and second integrated circuits 102, 104 may have a front surface and a back surface. The front surface may be an "active" surface in which electrical connections may be made. The back surface may be an "inactive" surface in which connections might not be made. FIG. 1A and FIG. 1B depict the active surfaces of the integrated circuits 102, 104.

The first and second integrated circuits 102, 104 may be rectangular in shape. Preferably, the first and second integrated circuits 102, 104 are approximately the same size. However, the first and second integrated circuits 102, 104 may vary in size. As depicted in FIG. 1, the first integrated circuit 102 is rotated 90-degrees with respect to the second integrated circuit 104.

In a preferred embodiment, the first and second integrated circuits 102, 104 may be thinned to a thickness of approximately 200-380 microns prior to sawing them into individual die. However, the first and second integrated circuits 102, 104 may be thinned more than preferred embodiment. For example, the first and second integrated circuits 102, 104 may be thinned to 100 microns. Alternatively, the first and second integrated circuits 102, 104 might not be thinned. When not thinned, the first and second integrated circuits 102, 104 may have a thickness of 725 microns for an eight inch wafer or a thickness of 675 microns for a six inch wafer. However, other wafer thicknesses may be used.

The first and second integrated circuits 102, 104 have a plurality of wire bond pads 106, 108 on the periphery of two opposing sides of the active surface. The wire bond pads 106, 108 may be used to provide connectivity when using wire bonding technology. Wire bonding technology includes any method of making an electrical connection between a chip and a package, including the use of wires and ribbons. While twenty-six wire bond pads 106, 108 are shown on each of the two opposing sides of the integrated circuits 102, 104, more or less than twenty-six wire bond pads 106, 108 may be used. As further described with reference to FIG. 7, the wire bond pads 108 on the second integrated circuit 104 may be used for wire bonding.

The first and second integrated circuits 102, 104 also have a plurality of solderable chip pads 110, 112 located in the interior of the integrated circuits 102, 104. The solderable chip pads 110, 112 may be used to provide connectivity when using flip chip technology. Flip chip technology encompasses a wide variety of techniques of attaching an active surface of a chip, including the use of solder bumps, gold bumps, adhesive bumps, and plastic nickel spheres. While FIG. 1 depicts one hundred and sixty-nine solderable chip pads 110, 112 in the interiors of the first and second integrated circuits 102, 104, more or less than one hundred and sixty-nine solderable chip pads 110, 112 may be used. However in a preferred embodiment, the first and second integrated circuits 102, 104 each have the same number of solderable chip pads 110, 112.

The solderable chip pads 110 in the interior of the first integrated circuit 102 may contain under bump metallization with solder bumps. A metal redistribution layer 114 may be deposited on the active surface of the first integrated circuit 102 to provide an interconnect layer. An example metal redistribution layer 114 is shown in FIG. 1A. However, it is understood that a variety of redistribution layer designs may be used. An automatic router is typically used to design the redistribution layer 114.

The metal redistribution layer 114 may connect various solderable chip pads 110 to metal pads on the first integrated circuit 102 so that power, ground, and I/O signals are supplied to required locations on the first integrated circuit 102 (e.g., power is supplied to the power bus on the first integrated circuit 102, ground is supplied to the ground bus on the first integrated circuit 102, and I/O is supplied to I/O circuits on the first integrated circuit 102). Further, the metal redistribution layer 114 may connect the solderable chip pads 110 on the first integrated circuit 102 to the wire bond pads 108 on the second integrated circuit 104 via the solderable chip pads 112 and a metal redistribution layer 116 on the second integrated circuit 104.

The solderable chip pads 112 in the interior of the second integrated circuit 104 may contain under bump metallization. The second integrated circuit 104 may be designed so that power, ground, and I/O are supplied through wire bond pads 108 on the perimeter of the second integrated circuit 104. Additionally or alternatively, the second integrated circuit 104 may be designed so that power, ground, and I/O for the first integrated circuit 102 are supplied to the solderable chip pads 112 in the interior of the second integrated circuit 104 that are connected to the wire bond pads 108 using the metal redistribution layer 116.

As described above, a metal redistribution layer may be located on the active surface of both the first and second integrated circuits 102, 104. The metal redistribution layers 114, 116 may provide interconnections within the first and second integrated circuits 102, 104 and between the first and second integrated circuits 102, 104. The interconnections may connect the wire bond pads 108 to appropriate interior solderable chip pads 110, 112. As a result of the interconnections, the signals needed on the first integrated circuit 102 may be supplied through the wire bond pads 108 on the second integrated circuit 104 when the first and second integrated circuits 102, 104 are connected together.

Typically, the first and second integrated circuits 102, 104 have different redistribution patterns. However, the first and second integrated circuits 102, 104 may have similar redistribution patterns. The process for patterning solderable pads, solder bumps, and metal redistribution layers on integrated circuits is well known in the integrated circuit industry, and is typically done to prepare integrated circuits for flip chip bonding.

Figure 2:
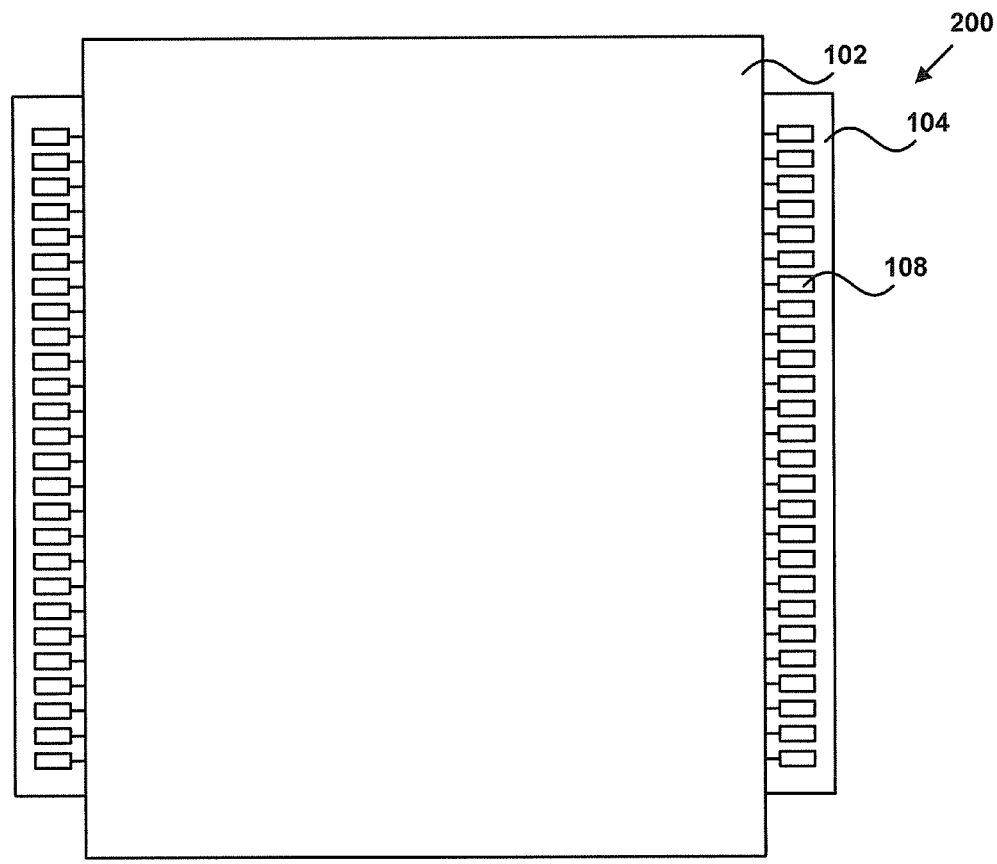
FIG. 2 is a top view of an integrated circuit pair formed by the first and second integrated circuits depicted in FIG. 1, according to an embodiment.

FIG. 2 depicts a top view of an integrated circuit pair 200 formed by the first and second integrated circuits 102, 104 depicted in FIG. 1. To assemble the integrated circuit pair 200, the first integrated circuit 102 is rotated 90 degrees (this rotation was already depicted in FIG. 1A) and flipped in relation to the second integrated circuit 102. By flipping the first integrated circuit 102, the active surface of the first integrated circuit 102 may be facing the active surface of the second integrated circuit 104.

The first and second integrated circuits 102, 104 in the integrated circuit pair 200 are then connected face-to-face via the solder bumps on the first integrated circuit 102 and the under bump metallization on the second integrated circuit 104. Because the first integrated circuit 102 is flipped, the inactive surface of the first integrated circuit 102 is shown in FIG. 2. While an underfill may be used between the two integrated circuits 102, 104, the underfill may not be necessary if the two integrated circuits 102, 104 have substantially equal thermal expansion coefficients and the underfill is not required for environmental protection.

As seen in FIG. 2, because the first and second integrated circuits 102, 104 are rectangular in shape and approximately the same size, the wire bond pads 106, 108 on one integrated circuit extends past the edge of the other integrated circuit. As the first integrated circuit 102 was flipped, only the wire bond pads 108 on the second integrated circuit 104 can be seen from the top view provided in FIG. 2. As a result, the wire bond pads 108 on the second integrated circuit 104 may be easily accessible for wire bonding.

Figure 3:
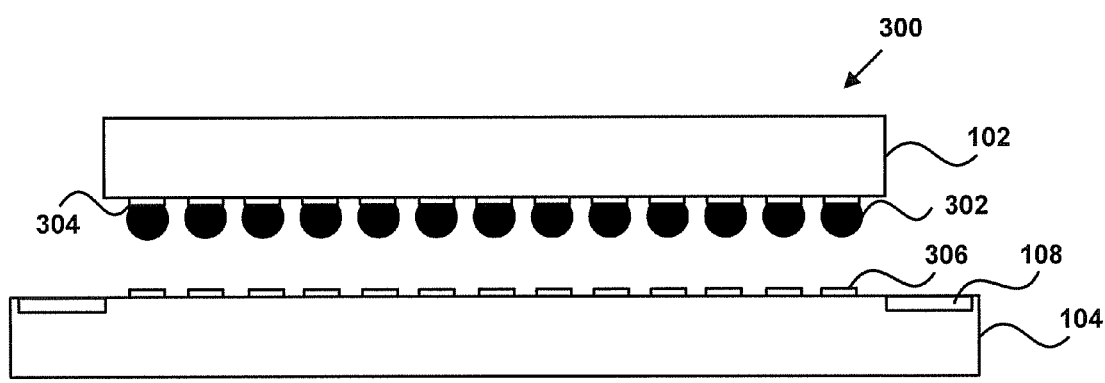
FIG. 3 is a side view of the integrated circuit pair depicted in FIG. 2, according to an embodiment.

FIG. 3 depicts a side view 300 of the integrated circuit pair 200 depicted in FIG. 2 prior to connection. The side view 300 depicts the first integrated circuit 102 flipped and positioned over the second integrated circuit 104. Solder bumps 302 may be located on under bump metallization 304 located on the first integrated circuit 102. The solder bumps 302 extend from the first integrated circuit 102 towards the under bump metallization 306 located on the second integrated circuit 104. When the flip chip bonding is completed, the solder bumps 302 may connect to the under bump metallization 306 on the second integrated circuit 104.

The side view 300 also depicts the wire bond pads 108 on the second integrated circuit 104 extending past the edge of the first integrated circuit 102. As a result, the wire bond pads 108 on the second integrated circuit 104 may be easily accessible for wire bonding purposes.

Once the integrated circuit pair 200 is formed, the integrated circuit pair 200 may be stacked with other integrated circuit pairs. Once stacked, wire bonding may be performed. Details regarding forming an integrated circuit stack are provided with reference to FIG. 7.

II. Forming an Integrated Circuit Pair According to a Second Embodiment

Figure 4A:
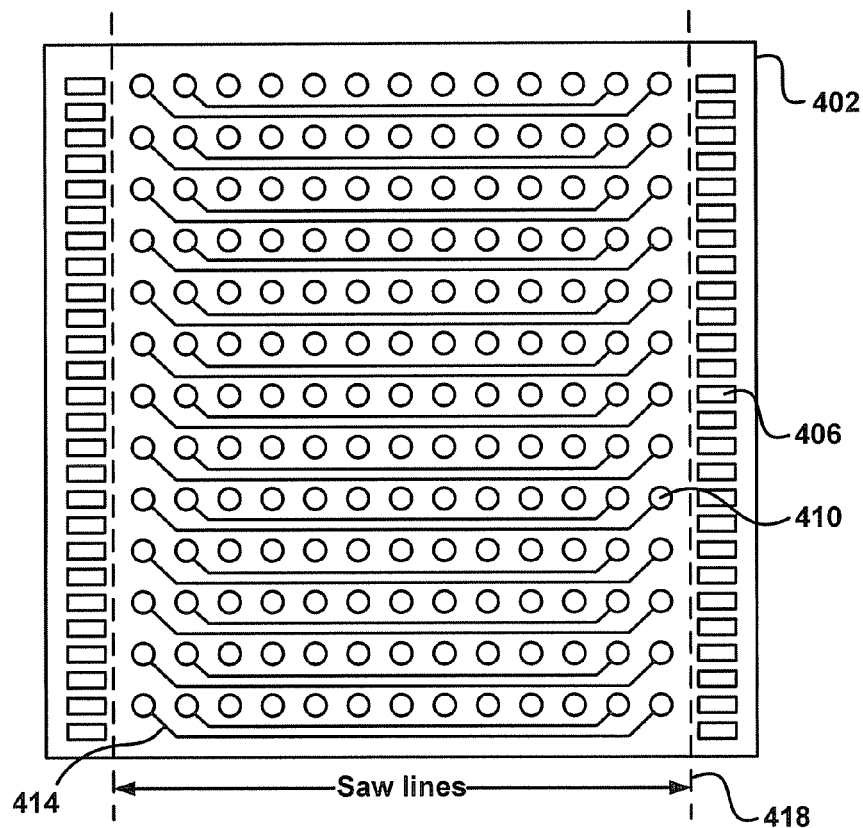
FIG. 4 is a top view of a first integrated circuit and a second integrated circuit, according to another embodiment.
Figure 4B:
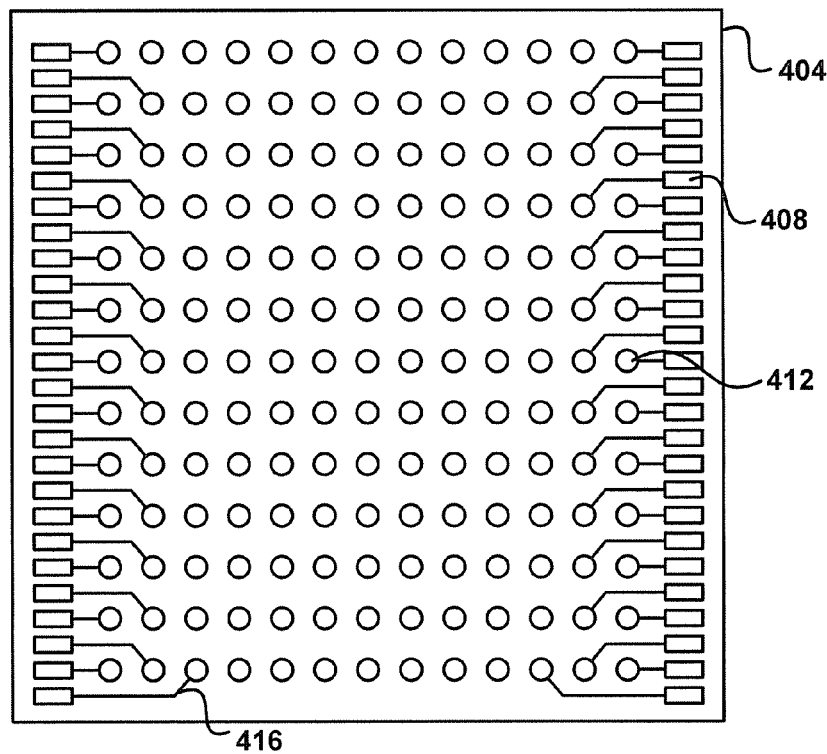

FIG. 4A depicts a top view of a first integrated circuit 402 and FIG. 4B depicts a top view of a second integrated circuit 404. The first and second integrated circuits 402, 404 may have a front surface and a back surface. The front surface may be an "active" surface in which electrical connections may be made. The back surface may be an "inactive" surface in which connections might not be made. FIG. 4A and FIG. 4B depict the active surfaces of the integrated circuits 402, 404.

The first and second integrated circuits 402, 404 may be rectangular in shape. Alternatively, the first and second integrated circuits 402, 404 may be square in shape. Preferably, the first and second integrated circuits 402, 404 are approximately the same size. However, the first and second integrated circuits 402, 404 may vary in size. In a preferred embodiment, the first and second integrated circuits 402, 404 may be thinned to a thickness of approximately 200-380 microns prior to sawing them into individual die. However, the first and second integrated circuits 402, 404 may be thinned more than preferred embodiment. For example, the first and second integrated circuits 402, 404 may be thinned to 100 microns. Alternatively, the first and second integrated circuits 402, 404 might not be thinned. When not thinned, the first and second integrated circuits 402, 404 may have a thickness of 725 microns for an eight inch wafer or a thickness of 675 microns for a six inch wafer. However, other wafer thicknesses may be used.

The first and second integrated circuits 402, 404 have a plurality of wire bond pads 406, 408 on the periphery of two opposing sides of the active surface. Alternatively, the first and second integrated circuits 402, 404 may have a plurality of wire bond pads 406, 408 on the periphery of all four sides of the active surface. The wire bond pads 406, 408 may be used to provide connectivity when using wire bonding technology. While twenty-six wire bond pads 406, 408 are shown on each of the two opposing sides of the integrated circuits 402, 404, more or less than twenty-six wire bond pads 406, 408 may be used. As further described with reference to FIG. 7, the wire bond pads 408 on the second integrated circuit 404 may be used for wire bonding.

The first and second integrated circuits 402, 404 also have a plurality of solderable chip pads 410, 412 located in the interior of the integrated circuits 402, 404. The solderable chip pads 410, 412 may be used to provide connectivity when using flip chip technology. While FIG. 4 depicts one hundred and sixty-nine solderable chip pads 410, 412 in the interiors of the first and second integrated circuits 402, 404, more or less than one hundred and sixty-nine solderable chip pads 410, 412 may be used. However in a preferred embodiment, the first and second integrated circuits 402, 404 each have the same number of solderable chip pads 410, 412.

The wire bond pads 406 on the first integrated circuit 402 may be removed at saw lines 418. The wire bond pads 406 may be removed from the first integrated circuit 402 by sawing or by any other compatible removal method. The removing of the wire bond pads 406 may result in the first integrated circuit 402 being more narrow than the second integrated circuit 404. Accordingly, when the first integrated circuit 402 is flipped and connected to the second integrated circuit 404, the wire bond pads 408 on the second integrated circuit 404 may extend past the edge of the first integrated circuit 402.

The solderable chip pads 410 in the interior of the first integrated circuit 402 may contain under bump metallization with solder bumps. A metal redistribution layer 414 may be deposited on the active surface of the first integrated circuit 402 to provide an interconnect layer. An example metal redistribution layer 414 is shown in FIG. 4A. However, it is understood that a variety of redistribution layer designs may be used. An automatic router is typically used to design the redistribution layer 414.

The metal redistribution layer 414 may connect various solderable chip pads 410 to metal pads on the first integrated circuit 402 so that power, ground, and I/O signals are supplied to required locations on the first integrated circuit 402 (e.g., power is supplied to the power bus on the first integrated circuit 402, ground is supplied to the ground bus on the first integrated circuit 402, and I/O is supplied to I/O circuits on the first integrated circuit 402). Further, the metal redistribution layer 414 may connect the solderable chip pads 410 on the first integrated circuit 402 to the wire bond pads 408 on the second integrated circuit 404 via the solderable chip pads 412 and a metal redistribution layer 416 on the second integrated circuit 404.

The solderable chip pads 412 in the interior of the second integrated circuit 404 may contain under bump metallization. The second integrated circuit 404 may be designed so that power, ground, and I/O are supplied through wire bond pads 408 on the perimeter of the second integrated circuit 404. Additionally or alternatively, the second integrated circuit 404 may be designed so that power, ground, and I/O for the first integrated circuit 402 are supplied to the solderable chip pads 412 in the interior of the second integrated circuit 404 that are connected to the wire bond pads 408 using the metal redistribution layer 416.

As described above, a metal redistribution layer may be located on the active surface of both the first and second integrated circuits 402, 404. The metal redistribution layers 414, 416 may provide interconnections within the first and second integrated circuits 402, 404 and between the first and second integrated circuits 402, 404. The interconnections may connect the wire bond pads 408 to appropriate interior solderable chip pads 410, 412. As a result of the interconnections, the signals needed on the first integrated circuit 402 may be supplied through the wire bond pads 408 on the second integrated circuit 404 when the first and second integrated circuits 402, 404 are connected together. Typically, the first and second integrated circuits 402, 404 have different redistribution patterns.

Figure 5:
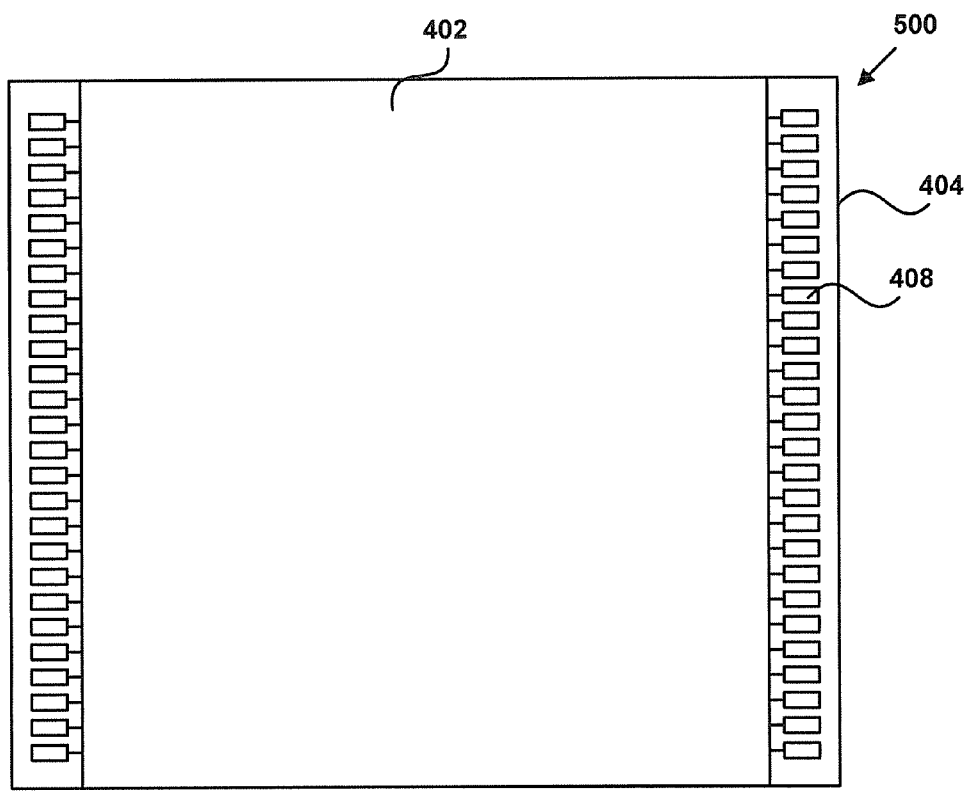
FIG. 5 is a top view of an integrated circuit pair formed by the first and second integrated circuits depicted in FIG. 4, according to an embodiment.

FIG. 5 depicts a top view of an integrated circuit pair 500 formed by the first and second integrated circuits 402, 404 depicted in FIG. 4. The integrated circuit pair 500 may be assembled by flipping the first integrated circuit 402 and connecting the active surface of the first integrated circuit 402 to the active surface of the second integrated circuit 404 using flip chip bonding. Because the first integrated circuit 402 is flipped, the inactive surface of the first integrated circuit 402 is shown in FIG. 5. While an underfill may be used between the two integrated circuits 402, 404, the underfill may not be necessary if the two integrated circuits 402, 404 have substantially equal thermal expansion coefficients and the underfill is not required for environmental protection.

Because the first integrated circuit 402 is narrower than the second integrated circuit 404 due to the removal of the wire bond pads 406 on the first integrated circuit 402, the wire bond pads 408 on the second integrated circuit 404 may extend past the edge of the first integrated circuit 402. As a result, the wire bond pads 408 on the second integrated circuit 404 may be easily accessible for wire bonding.

Figure 6:
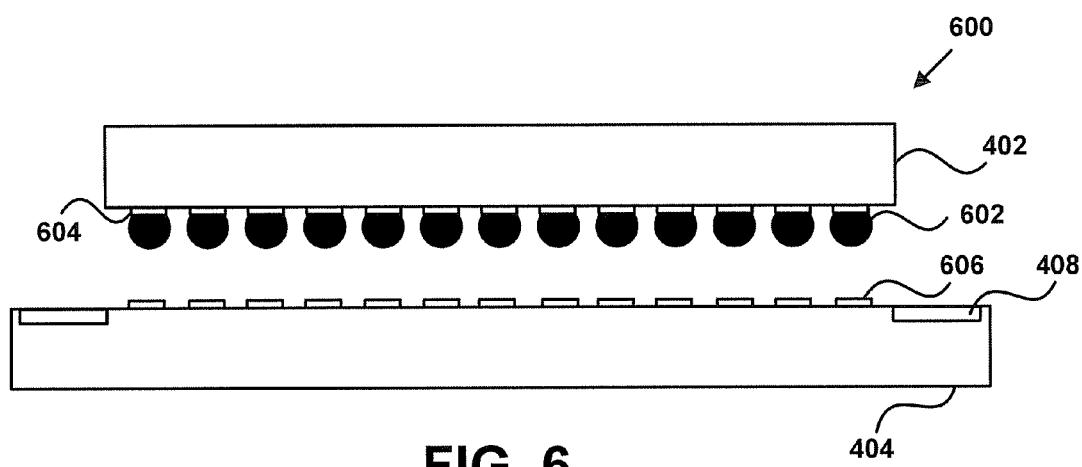
FIG. 6 is a side view of the integrated circuit pair depicted in FIG. 5, according to an embodiment.

FIG. 6 depicts a side view 600 of the integrated circuit pair 500 depicted in FIG. 5 prior to connection. The side view 600 depicts the first integrated circuit 402 flipped and positioned over the second integrated circuit 404. Solder bumps 602 are located on under bump metallization 604 located on the first integrated circuit 402. The solder bumps 602 extend from the first integrated circuit 402 towards the under bump metallization 606 located on the second integrated circuit 404. When the flip chip bonding is completed, the solder bumps 602 may connect to the under bump metallization 606 on the second integrated circuit 404.

The side view 600 also depicts the wire bond pads 408 on the second integrated circuit 404 extending past the edge of the first integrated circuit 402. As a result, the wire bond pads 408 on the second integrated circuit 404 may be easily accessible for wire bonding purposes.

Once the integrated circuit pair 500 is formed, the integrated circuit pair 500 may be stacked with other integrated circuit pairs. Once stacked, wire bonding may be performed. Details regarding forming an integrated circuit stack are provided with reference to FIG. 7.

III. Forming an Integrated Circuit Pair According to a Third Embodiment

Figure 8:
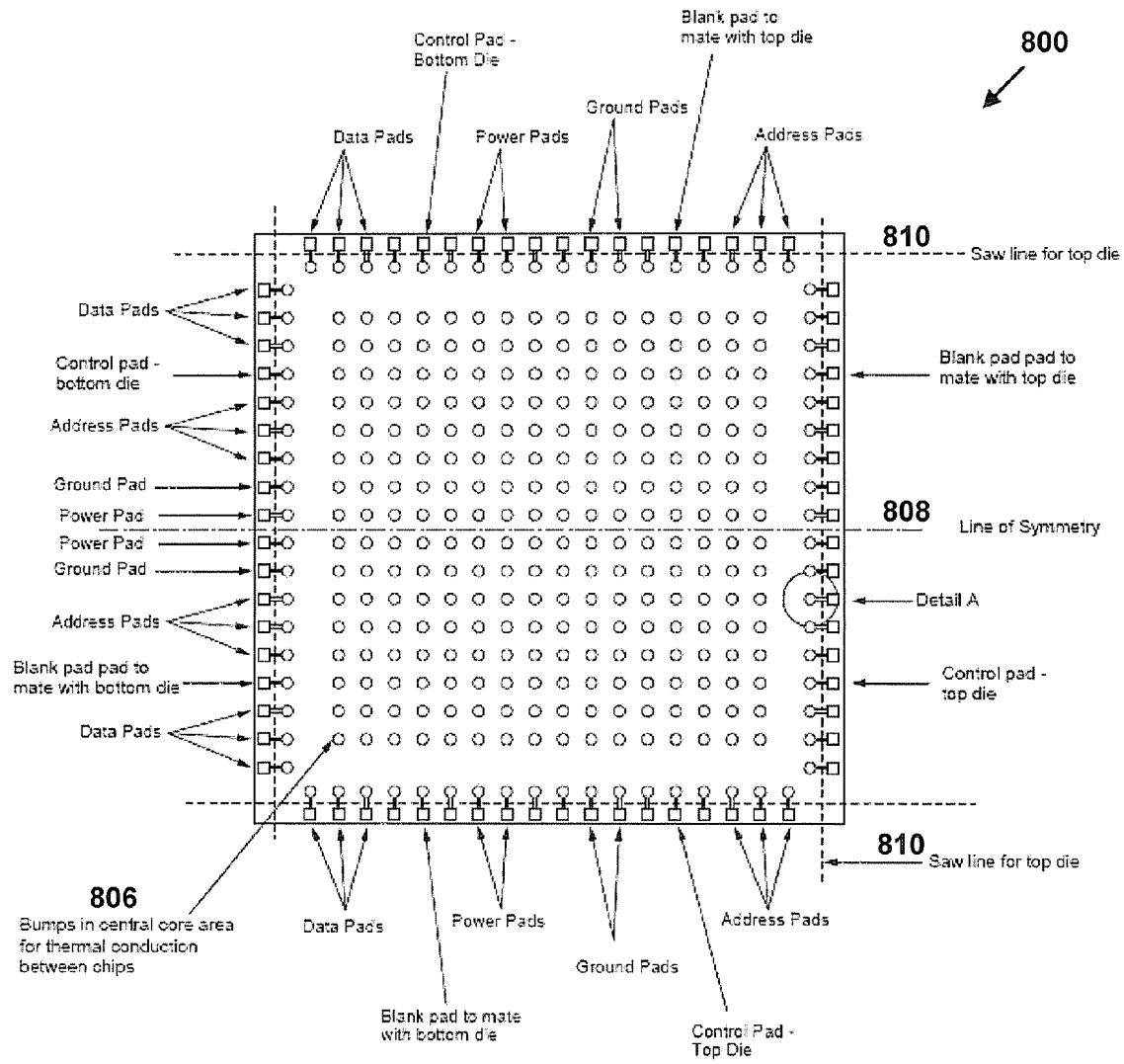
FIG. 8 is a top view of an integrated circuit, according to another embodiment.
Figure 8:
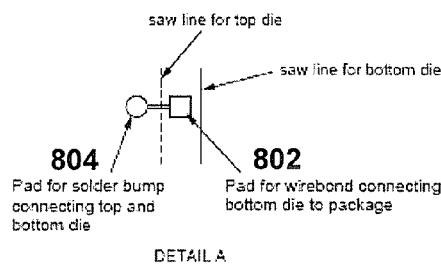

FIG. 8 is a top view of an integrated circuit 800. The integrated circuit 800 may have a front surface and a back surface. The front surface may be an "active" surface in which electrical connections may be made. The back surface may be an "inactive" surface in which connections might not be made. FIG. 8 depicts the active surface of the integrated circuit 800.

The integrated circuit 800 preferably has a square or rectangular shape. The integrated circuit 800 has a plurality of wire bond pads 802 on the periphery of the sides of the active surface. The wire bond pads 802 are shown on all four sides of the active surface in FIG. 8; however, the wire bond pads 802 may be on less than all four sides depending on the integrated circuit design. The wire bond pads 802 may be used to provide connectivity when using wire bonding technology. While seventy-two wire bond pads 802 are shown on the integrated circuit 800, more or less than seventy-two wire bond pads 802 may be used.

The wire bond pads 802 may provide connectivity for both inputs and outputs of the integrated circuit 800. As depicted in FIG. 8, the wire bond pads 802 may be designated for data lines, address lines, control signals, power supply, ground supply, and so on. Not all of the wire bond pads 802 may be designated for connection to an input and/or output signal (i.e., blank wire bond pads). Of course, other wire bond pad layout designs are possible.

FIG. 8 depicts the signal placements and power/ground placements for a memory chip, with address, data, power, and ground pads placed symmetrically about a line 808 through the center of the integrated circuit 800. Address pads are placed symmetrically across from address pads, and data pads are placed symmetrically across from data pads. Control signals which are unique to the integrated circuit 800 are placed opposite a blank solderable chip pad on the opposite side of the integrated circuit 800, which is not connected to any circuitry within the integrated circuit 800. Power and ground connections are also placed symmetrically with the same pad on the opposite side of the integrated circuit 800. The symmetrical placement of pads allows two of the same integrated circuits 800 to share the same common electrical connections when two integrated circuits 800 are connected together face-to-face through a solder bump, while also allowing unique electrical connections to pads unique to one of the integrated circuits 800 within the pair.

Each of the wire bond pads 802 may be connected, typically via a metal trace, to a solderable chip pad 804. The solderable chip pads 804 may be used to provide connectivity when using flip chip technology. While FIG. 8 depicts seventy-two solderable chip pads 804 connected to the wire bond pads 802, more or less than seventy-two solderable chip pads 804 may be used depending on the number of wire bond pads 802 used.

The integrated circuit 800 also has an array of solderable chip pads 806 located in the interior of the integrated circuit 800. The array of solderable chip pads 806 may provide a heat conduction path between a bottom die and a flipped top die in an integrated circuit pair. The array of solderable chip pads 806 is also designed to maintain symmetry about the center line 808. While FIG. 8 depicts two hundred and fifty-six solderable chip pads 806 in the interior of the integrated circuit 800, more or less than two hundred and fifty-six solderable chip pads 806 may be used in the array.

The integrated circuit 800 is designed to support two different die sizes, a larger bottom die with both inner and outer pads 802, 804, and a smaller top die with only the inner pads 804. The two different die sizes may be obtained by sawing the top die along saw lines 810. By sawing the top die along saw lines 810, the wire bond pads 802 on a top integrated circuit in an integrated circuit pair may be removed. The wire bond pads 802 may be removed from the top integrated circuit by sawing or by any other compatible removal method.

Removing of the wire bond pads 802 may result in the top integrated circuit being smaller than a bottom integrated circuit in an integrated circuit pair. Accordingly, when the top integrated circuit is flipped and connected to the bottom integrated circuit, the wire bond pads 802 on the bottom integrated circuit may extend past the edge of the top integrated circuit. Beneficially, this method uses only one set of masks and one integrated design on the wafer.

Figure 9:
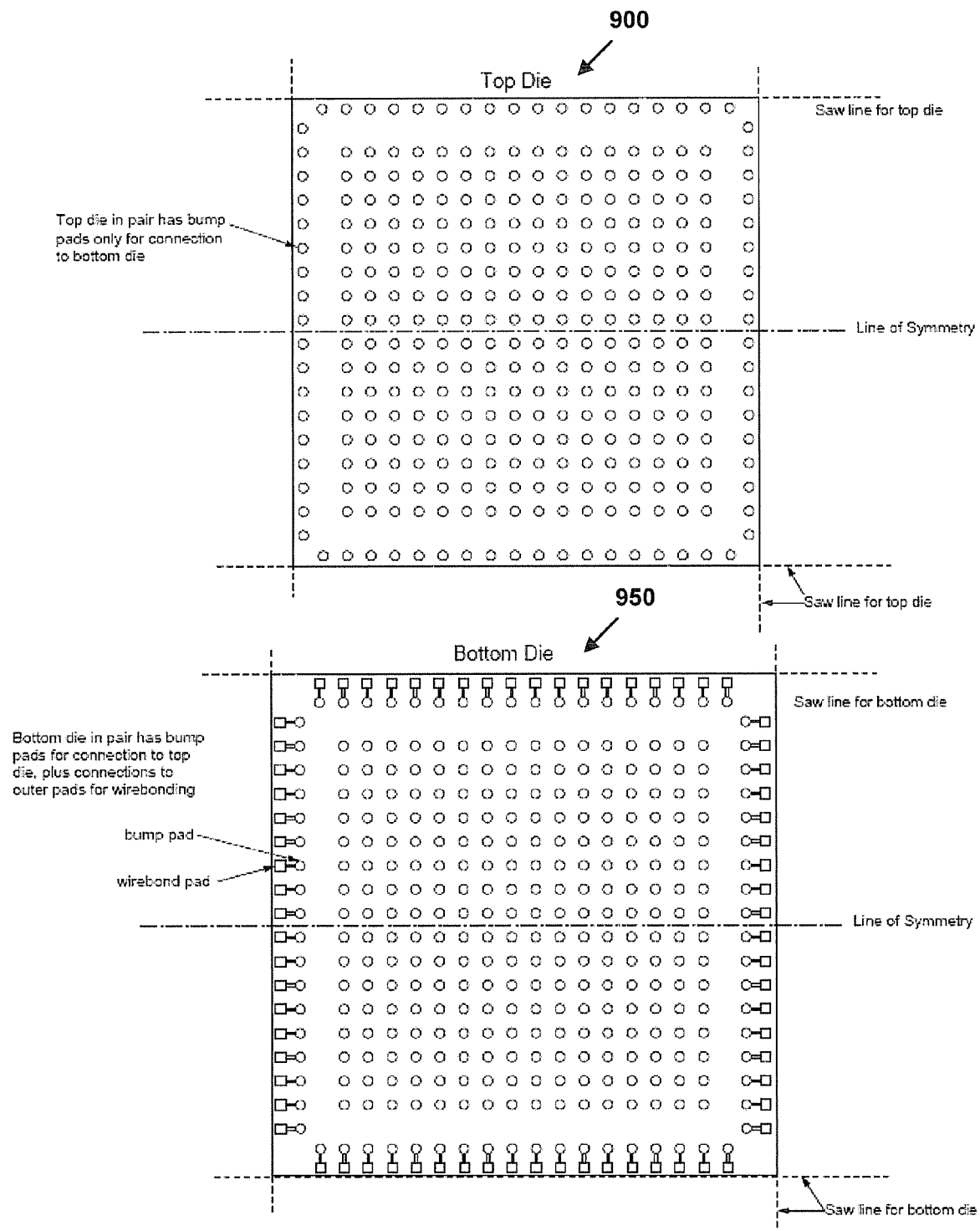
FIG. 9 is a top view of a top die and a bottom die for stacking the integrated circuit depicted in FIG. 8, according to an example.

FIG. 9 is a top view of a top die 900 and a bottom die 950. In this example, the top and bottom dies 900, 950 may have different patterns, differing only in the bond pad metallization and passivation openings. The bottom die 950 bond pad pattern includes the inner pad 804, the connecting link, and the outside pad 802, while the top die 900 bond pad pattern includes only the inner pads 804. The underneath layers are the same on both wafers 900, 950, and the position of the die centers is the same on both wafers 900, 950. The top die 900 and the bottom die 950 are cut outside the respective outer pads to two different sizes Because the top integrated circuit 900 is smaller than the bottom integrated circuit 950 due to the different patterns and cut locations, the wire bond pads 802 on the bottom integrated circuit 950 may extend past the edge of the first integrated circuit 900. As a result, the wire bond pads 802 on the bottom integrated circuit 950 may be easily accessible for wire bonding.

Once the integrated circuit pair is formed, the integrated circuit pair may be stacked with other integrated circuit pairs. Once stacked, wire bonding may be performed. Details regarding forming an integrated circuit stack are provided with reference to FIG. 7.

This embodiment is especially suitable to stacking memory chips and other integrated circuits that operate by applying many common input/output signals and only a few unique signals. As shown in FIGS. 8 and 9, the integrated circuit 800 has multiple data and address pads that are common between the top and bottom dies 900, 950, and are placed symmetrically on the integrated circuit 800. Unique memory control signals are provided independently to each die in the stack. Pads for unique memory control signals are placed opposite a blank solderable chip pad. The optional array of solder bumps 806 placed over the central area of the integrated circuit 800 provides for heat transfer through the stack. When stacking multiple pairs of die, the top die in the die stack pair serves as a spacer between the first pair of integrated circuits and the second pair stacked on top of the first pair of integrated circuits.

A simple stacking method for stacking integrated circuits is provided by using a single integrated circuit design with symmetry in physical bond pad placement and signal distribution, such that two die can be connected face-to-face with appropriate signal connections made to both integrated circuits. This design supports two chip sizes, a larger size for the bottom die that is mounted face-up and connected to the package through wire bond connections, and a smaller die that is placed face-down and connected to the larger die through solder bumps. This design eliminates the use of two mirrored integrated circuits or redistribution layers, and the associated costs of two mask sets and two integrated circuit types.

While three embodiments for forming an integrated circuit pair have been described, other methods and variations may also be used.

IV. Forming an Integrated Circuit Stack

Figure 7:
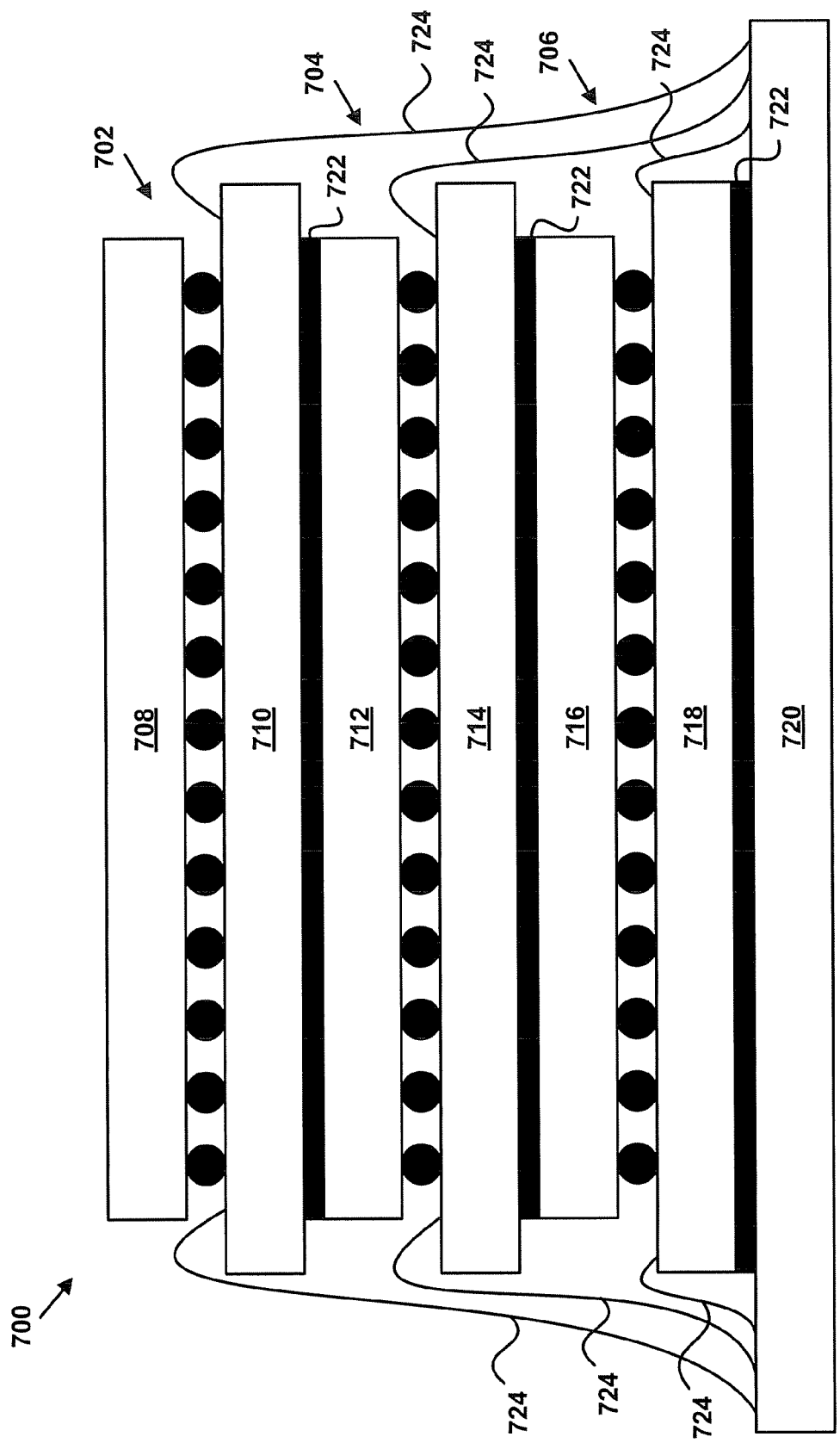
FIG. 7 is a side view of stacked integrated circuit pairs, according to an embodiment.

FIG. 7 depicts a side view of a stack 700 of integrated circuit pairs. FIG. 7 depicts three integrated circuit pairs 702-706. However, there may be more or less than three integrated circuit pairs in the stack 700. The first integrated circuit pair 702 may include a first integrated circuit 708 that is connected to a second integrated circuit 710 using flip chip bonding. The second integrated circuit pair 704 may include a first integrated circuit 712 that is connected to a second integrated circuit 714 using flip chip bonding. The third integrated circuit pair 706 may include a first integrated circuit 716 that is connected to a second integrated circuit 718 using flip chip bonding. The three integrated circuit pairs 702-706 may be formed by using any combination of the methods described with reference to FIGS. 1-6.

The third integrated circuit pair 706 may be attached to a substrate 720 by using a standard die attach material 722, such as an epoxy adhesive. Alternatively, the third integrated circuit pair 706 may be attached to a printed circuit board or a package. The inactive surface of the second integrated circuit 718 in the third integrated circuit pair 706 may be bonded to the substrate 720 with the adhesive 722. Bonding wire 724 may be used to connect the substrate 720 to wire bond pads on the second integrated circuit 718 in the third stacked pair 706. The bonding wire may be aluminum, gold, or any other appropriate wire bonding material.

The second integrated circuit pair 704 may be attached to the third integrated circuit pair 706 using the standard die attach material 722. The inactive surface of the second integrated circuit 714 in the second integrated circuit pair 704 may be bonded to the inactive surface of the first integrated circuit 716 in the third integrated circuit pair 706 with the adhesive 722. The bonding wire 724 may be used to connect the substrate 720 to wire bond pads on the second integrated circuit 714 in the second integrated circuit pair 704.

The process of attaching and wire bonding integrated circuit pairs may be repeated as many times as desired. For the stack 700 depicted in FIG. 7, this process may be continued one additional time as follows. The first integrated circuit pair 702 may be attached to the second integrated circuit pair 704 using the standard die attach material 722. The inactive surface of the second integrated circuit 710 in the first integrated circuit pair 702 may be bonded to the inactive surface of the first integrated circuit 712 in the second integrated circuit pair 704 with the adhesive 722. The bonding wire 724 may be used to connect the substrate 720 to wire bond pads on the second integrated circuit 710 in the first integrated circuit pair 702.

As seen in FIG. 7, the first integrated circuit 716 in the third integrated circuit pair 706 may provide spacing between the second integrated circuit 714 in the second integrated circuit pair 704 and the second integrated circuit 718 in the third integrated circuit pair 706. Likewise, the first integrated circuit 712 in the second integrated circuit pair 704 may provide spacing between the second integrated circuit 710 in the first integrated circuit pair 702 and the second integrated circuit 714 in the second integrated circuit pair 704. This spacing may provide clearance for the wire bonds 724 to reach the substrate 720 without obstruction.

This stacking approach may achieve efficient heat removal from the integrated circuits by providing a conduction pathway through the large-cross section of the integrated circuits and the integrated circuit connections to the substrate 720. This heat conduction path may be enhanced by using a thin thermally conductive epoxy bond between the stacked integrated circuits and by using a full array of solder connections in the flip chip interfaces.

Beneficially, the design of the integrated circuits in the stack 700 may be independent of the position of the integrated circuit in the stack 700 (i.e., bottom, middle, top). If fact, each integrated circuit in the stack 700 may have the same circuit design. This method of stacking integrated circuits is particularly well-suited for stacking memory circuits. In memory circuit applications, the integrated circuits in the stack may share data and address signals, with only a minimal number of unique connections for each individual integrated circuit in the stack.

It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

We claim:

1. A method comprising:
providing a first integrated circuit, a second integrated circuit, a third integrated circuit, and a fourth integrated circuit, wherein the integrated circuits have a substantially similar integrated circuit design, and signal pads in common to the integrated circuits are placed symmetrically about a line through a center of the integrated circuits;
creating a first integrated circuit pair by flip chip bonding the first integrated circuit to the second integrated circuit, wherein the first integrated circuit is smaller than the second integrated circuit, and wherein creating the first integrated circuit pair includes removing wire bond pads from the first integrated circuit and positioning active surfaces of the first and second integrated circuits to be facing each other prior to the flip chip bonding;
creating a second integrated circuit pair by flip chip bonding the third integrated circuit to the fourth integrated circuit, wherein the third integrated circuit is smaller than the fourth integrated circuit;
attaching the first integrated circuit pair to a substrate;
stacking the second integrated circuit pair on the first integrated circuit pair;
connecting the second integrated circuit to the substrate using wire bonding; and
connecting the fourth integrated circuit to the substrate using wire bonding.

2. The method of claim 1, further comprising placing a signal pad unique to one of the integrated circuits opposite a blank pad on an opposite side of the integrated circuit.

3. The method of claim 1, wherein creating the first integrated circuit pair includes using two integrated circuit patterns for the first and second integrated circuits, wherein pattern differences are limited to bond pad metallization and passivation openings, and positioning active surfaces of the first and second integrated circuits to be facing each other prior to the flip chip bonding.

4. The method of claim 1, wherein creating the second integrated circuit pair includes removing wire bond pads from the third integrated circuit and positioning active surfaces of the third and fourth integrated circuits to be facing each other prior to the flip chip bonding.

5. The method of claim 1, wherein creating the second integrated circuit pair includes using two integrated circuit patterns for the third and fourth integrated circuits, wherein pattern differences are limited to bond pad metallization and passivation openings, and positioning active surfaces of the third and fourth integrated circuits to be facing each other prior to the flip chip bonding.

6. The method of claim 1, wherein attaching the first circuit pair to the substrate includes attaching an inactive surface of the second integrated circuit to the substrate using an adhesive.

7. The method of claim 1, wherein stacking the second integrated circuit pair on the first integrated circuit pair includes attaching an inactive surface of the fourth integrated circuit to an inactive surface of the first integrated circuit using an adhesive.

8. The method of claim 1, wherein connecting the second integrated circuit to the substrate using wire bonding includes attaching bonding wires between the second integrated circuit and the substrate.

9. The method of claim 1, wherein connecting the fourth integrated circuit to the substrate using wire bonding includes attaching bonding wires between the fourth integrated circuit and the substrate.

* * * * *